United States Patent [19]
White et al.

[11] Patent Number: 5,834,786
[45] Date of Patent: Nov. 10, 1998

[54] HIGH CURRENT RIBBON BEAM ION IMPLANTER

[75] Inventors: Nicholas R. White, Wenham; Manny Sieradzki, Manchester, both of Mass.

[73] Assignee: Diamond Semiconductor Group, Inc., Gloucester, Mass.

[21] Appl. No.: 761,065

[22] Filed: Dec. 5, 1996

Related U.S. Application Data

[60] Provisional application No. 60/021,794 Jul. 15, 1996.

[51] Int. Cl.$^6$ .................................................. H01J 37/317
[52] U.S. Cl. ...................................... 250/492.21; 250/398
[58] Field of Search ............................... 250/492.21, 398

[56] References Cited

U.S. PATENT DOCUMENTS

| | | | |
|---|---|---|---|
| 3,845,312 | 10/1974 | Allison, Jr. ................................ | 250/398 |
| 4,017,403 | 4/1977 | Freeman .................................... | 250/492 |
| 4,486,664 | 12/1984 | Wollnik ..................................... | 250/396 |
| 4,661,712 | 4/1987 | Mobley ...................................... | 250/492.2 |
| 4,745,281 | 5/1988 | Enge ........................................... | 250/356 |
| 4,914,305 | 4/1990 | Benveniste et al. ................... | 250/492.3 |
| 5,126,575 | 6/1992 | White ......................................... | 250/492.3 |
| 5,350,926 | 9/1994 | White et al. ............................. | 250/492.21 |

FOREIGN PATENT DOCUMENTS

| | | |
|---|---|---|
| 0 473 097 | 3/1992 | European Pat. Off. . |
| 59-054161 | 3/1984 | Japan . |
| 59-230242 | 12/1984 | Japan . |
| 4137347 | 5/1992 | Japan . |

OTHER PUBLICATIONS

Alexeff, I., "Instability Threshold for a Calutron (Isotope Seperator) with only one Isotope Species," *IEEE Transactions on Plasma Science*, vol. PS–11, No. 2, 90–91 (1983).

White, N. and Purser, K., "The Design of Magnets with Nondipole Field Components," *Nuclear Instruments and Methods in Physics Research*, vol. A258, 437–442 (1987).

*Primary Examiner*—Jack I. Berman
*Attorney, Agent, or Firm*—Lahive & Cockfield,LLP

[57] ABSTRACT

A compact high current broad beam ion implanter employs a high current density source, a bending magnet to steer the beam and straighten trajectories, and a multipole unit extending across the beam path to tailor a precise one-dimensional beam current distribution which yields a uniform implantation dose with a possibly non-uniform workpiece transport assembly. In one embodiment, the multipole unit is a separate magnet assembly positioned adjacent to a output face of the bending magnet, and includes one or more ranks of closely-spaced pole elements, controlled so the drive current or position of each pole element is varied to affect a narrow band of the beam passing over that element. In another embodiment, the bending magnet is an analyzing magnet which directs a desired species through a resolving slit, and a second magnet deflects the resultant beam while rendering it parallel and further correcting it along its width dimension. As with the first embodiment, multipole elements are adjusted to fit the derived profile. Both magnets preferably have relatively large pole gaps, wide input and output faces, and deflect through a small radius of curvature to produce a beam free of instabilities. The multipole elements are adjacent to or incorporated in the dipoles, preferably at a downstream side, and operate to shift beam power along the width dimension, locally adjusting the beam current density to achieve the desired profile. A separate multipole array, such as an electromagnet with blade poles oriented at progressive angles may adjust the entrance beam.

14 Claims, 6 Drawing Sheets

HIGH CURRENT RIBBON BEAM ION IMPLANTER

This application claims the benefit of U.S. Provisional application Ser. No. 60/021,794, filed Jul. 15, 1996.

BACKGROUND OF THE INVENTION

The present invention relates to ion implantation systems, and more specifically to the design of high current implanters for production line implantation of ions into large workpieces such as semiconductor wafers, flat panel displays and the like.

The doping of semiconductors with electrically active elements is now performed almost exclusively with ion implanters. Several recent trends in semiconductor technologies suggest characteristics that would be desirable in the design of ion implanters. These trends include a trend to larger size workpieces, and a trend to higher dose but lower energy implantation, with relatively strict limits on beam angle.

High current ion implanters may be broadly defined as the class of instruments in which the ion beam current is great enough that it must be space-charge neutralized to be transported through the ion implanter. This property generally holds true for currents in excess of 1 mA. To meet the usual range of practical applications, high current implanters are typically specified to deliver up to between 15 and 30 mA of n-type dopant ions, and up to between 6 and 12 mA of boron ions. The recent state of development of these machines was such that all high current implanters commercially available in 1991 implant batches of wafers, and achieve uniformity of doping by scanning, placing the wafers on a spinning disk, wheel, or drum, to provide one scanning direction, and either moving the wafer carrier normal to the beam, or magnetically scanning the beam to achieve another scanning direction. The scanning both increases the coverage available from a given beam, and decreases the total variation in delivered dose from that expected with a given degree of beam inhomogeneity.

Batch processing systems of this type suffer from reduced throughput when the batch size is mismatched to the size of the production lot, making it very expensive to test a process, since a complete batch must be processed every time. Rotating disk assemblies must be cone-shaped if centrifugal force is relied upon to retain the wafers, causing variations in implant angle. The size of a spinning disk assembly suitable for 300 mm or larger substrates is great, since the turntable radius must be relatively large compared to workpiece dimensions. This, in turn, dictates a high intrinsic value of a single batch. Serial systems, which process each workpiece individually, may therefore be preferred when the technology permits.

However, because of the difficulty in making a high current beam of high uniformity, commercial machines have relied largely, if not exclusively, on batch processing machines having large motive assemblies to achieve uniformity by spatial averaging.

Applicant's earlier U.S. Pat. No. 5,350,926 describes a more recent approach in which a broad beam implanter has a sufficiently uniform beam for serial implanting and achieves a high current by operating with a low beam current density in the magnet gap. However, such uniformity is achieved at a relatively high cost in equipment for steering and controlling the beam quality, and its use of an analyzer necessarily reduces throughput in situations where the source beam might otherwise be sufficiently clean or uniform to meet process chemistry and energy constraints.

Accordingly, it would be desirable to develop an ion beam apparatus of high current that covers a large area uniformly and efficiently at suitable energies, yet is useful for commercial implanting tasks where constraints of beam purity, uniformity or implant angle are relaxed.

It would also be desirable to develop an apparatus of high current that covers a large area uniformly and efficiently during batch processing of workpieces on a spinning drum or other transport mechanism.

SUMMARY OF THE INVENTION

One or more of these goals are achieved in accordance with one aspect of the present invention by providing a high current ion beam which is expanded to a ribbon shape having both a controlled degree of parallelism and an integrated beam intensity which accurately matches a profile in one direction, and then moving one or more workpieces across the beam with a regular but not necessarily homogeneous velocity such that each workpiece receives a uniform dose. The ribbon beam has a width substantially over 150 millimeters, and preferably over about 300 millimeters to match the workpiece dimension.

In one embodiment, an ion source and a first dipole bending magnetic lens achieve a controlled degree of magnification along a single dimension which is referred to below as the width dimension of the beam, and which may, for example, be parallel to a slot-shaped ion extraction aperture of the source, from which the beam expands in at least one direction. The beam from the source passes between the poles of the magnet assembly which bends the ion trajectories along a curve and slightly focuses the beam to decrease or even remove its divergence in at least one, preferably its major cross dimension, while multipole elements located in or near the magnet assembly locally adjust the current density in each of a plurality of narrow width strips such that beam current density across the width of the beam has the specified shape or distribution within a narrow tolerance, which may be held to under one percent.

In a preferred implementation of this embodiment, the magnet assembly includes only a single dipole magnet which bends a divergent beam from the input source through an angle of 45–90 degrees and without bringing the beam to a focus produces a broad workpiece-spanning curtain output beam in which ion trajectories have been rendered substantially parallel. A multipole array, i.e., a set of separately-controllable pole elements are arrayed across the beam width in a flat face of the dipole or near its edge, and a beam profiler is provided to measure the one-dimensional current density along the width of the beam at an output plane. The field at each of the multipole elements is adjusted to locally alter the ion trajectories, changing the current density in narrow bands to fit the desired current profile. A workpiece moves across the beam to receive a uniform implant dose. By way of example, the beam may be controlled so that its one-dimensional integrated current density in the scan direction is constant at each point along the width, and a simple uniform speed conveyor may carry the workpiece; alternatively, the beam current profile may change linearly with width coordinate, and the workpiece may be carried by a rotating stage so that its speed is proportional to radial position. In this case, with the beam width oriented along the radius, dwell time under the beam follows a hyperbolic distribution which compensates for the different magnitude of beam current at each position to produce a constant total delivered dose at each point of the workpiece.

In a second embodiment, the first magnet of the assembly is an analyzing lens which deflects the beam so it passes cleanly through a resolving slot aperture. A second magnet with larger pole width forms a further lens to deflect the divergent beam leaving the resolving aperture and render it substantially parallel in both directions. While operating at high current, the current density of the expanded beam is low. The overall physical architecture of this embodiment is similar to that of the aforesaid '926 patent, but the multipole elements are operated to produce a stationary but non-constant current density distribution across the beamwidth.

As described in applicant's aforesaid '926 patent, both the first and second magnetic lenses may each deflect the beam through an arc of between approximately 90° and 70°, in the same sense, so that the expanded, analyzed and substantially parallel beam is turned back toward the source direction, resulting in a compact implantation assembly. Preferably, at least the first magnet has curved input and output faces, and has a wide gap allowing the source beam to diverge and largely occupy the gap. In or proximate to at least one of the lenses, multipole elements are placed across the beam width direction and modify aberrations to achieve beam expansion or compression in the width dimension which varies at each of the pole elements so as to redistribute or correct the beam current to reduce variations from the desired stationary profile, making it, for example, substantially match a linear current density distribution along the width dimension of the beam. Preferably the multipole elements are provided by a plurality of movable bars or pole pieces which extend vertically within a flat face of one pole of the large dipole, and are adjusted by steppers in response to beam profile measurements to vary the localized aberrations as described herein for correcting the beam profile.

In this embodiment, for high perveance operation, the beam occupies a large cross-sectional area within the dipole; for example, the pole gap may be greater than about one quarter of the radius of curvature of the ion beam trajectory, with the analyzing slot placed between the first and second magnets as described in the aforesaid '926 patent. The magnets may also be wired in series, so that the magnetizing current is identical in each magnet and any current transients or transients in beam energy effectively blank the beam by causing it to miss the analyzing aperture. The initial ion source is preferably an ionization chamber with a slot in a convex surface through which ions are extracted as a beam that diverges radially away from the center of curvature of the slot, and may be configured so that its one-dimensional power distribution approximately matches the desired profile of the final output beam. A workpiece is scanned through the output beam, with the scan velocity being inverse to the beam profile, thus resulting in a substantially constant or homogeneous dose.

As noted above, in this analyzed-beam embodiment, the beam current density profile is non-constant and is stationary, however it need not be linear. For example, the invention contemplates that for use with a spinning drum or swinging arm transport in which workpieces of dimension "w" occupy radial positions between (r) and (r+w), the beam current density will be adjusted to correct the hyperbolic dwell time curve between (1/r+w) and (1/r), i.e., increase linearly with radial position to exactly compensate for the dwell time under the beam of each point on the workpiece. Indeed, by controlling to a beam current density profile which is more sharply-changing, (e.g., corresponding to a more steeply-changing region of the (1/r) hyperbola) applicant can decrease the radius of the drum transport assembly and provide a more compact implantation assembly while still achieving a uniform implantation dose. Other types of mechanical scanning assemblies, for example for a linear scanning assembly that must slow down and reverse direction, may be operated with the present system so that at least a portion of their non-constant travel occurs while it is still in the beam path. In particular, the beam current density profile may be adjusted to correct for the characteristic non-linear or approximately linear dwell times of radial drum-type scanning, of swinging pendulum-type carriers, and of other known wafer transport assemblies. This relaxes certain constraints on the transport mechanism, and allows the transport to be selected for characteristics other than strict constancy of transport velocity, such as for having a relatively simple mechanical structure, a low cost or decreased particle-generation characteristics.

The multipole elements operate by changing position to define different pole gaps, or by separately energizing magnet coils with a magnitude of drive current that is varied locally to locally control the field in the gap. In either case, changing the field varies the path separation of ions travelling through the magnet gap, thus changing the deflection angle in the narrow strip of beam passing over each multipole element, thus increasing and decreasing the magnification locally in the width dimension, hence changing the current density as measured downstream, in the narrow band passing over each pole element. That is, the poles are each controlled to effectively shift ions and expand or contract a strip, providing changes in beam current density to alter the beam at a number of positions across the width coordinate. In a preferred embodiment, a narrow slotted Faraday cup with its slot oriented perpendicular to its motion is moved across the output beam width direction to measure the one-dimensional current density of the resulting beam, and a controller responds to the measured beam conditions to adjust the poles to obtain a stable output beam with the required output profile along the beam width at the implantation plane.

In accordance with yet another aspect of the invention, the invention includes a general method of achieving a uniform implantation dose in a workpiece by activating a set of multipole elements which extend across the beamwidth of an ion beam passing through a dipole magnet in an implantation beamline.

BRIEF DESCRIPTION OF THE DRAWINGS

These and other features of the invention will be understood by a person skilled in the art from the description to follow, taken together with illustrative drawings, wherein.

DETAILED DESCRIPTION

Figure 1:
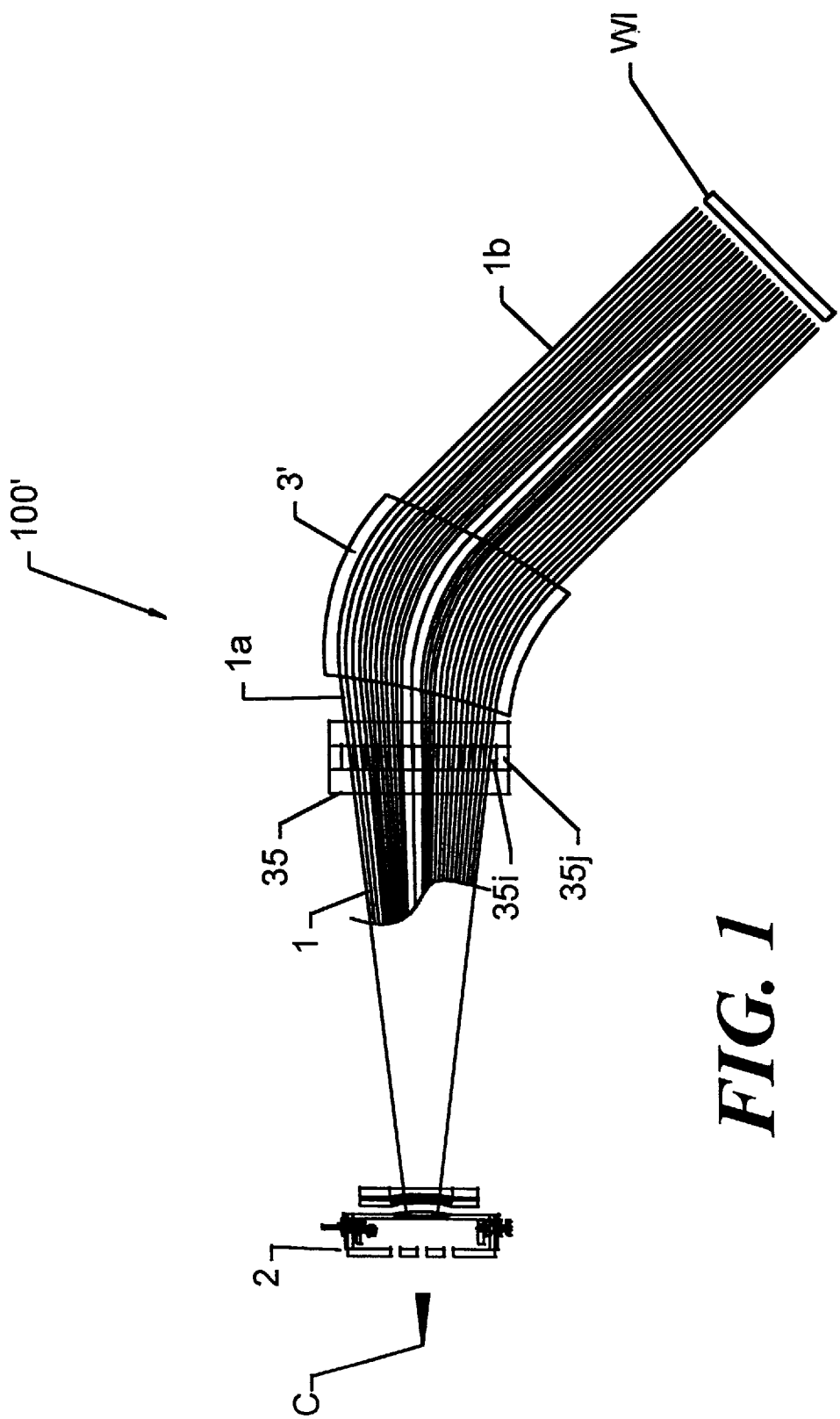
FIG. 1 is a drawing, partly schematic, of an ion beam apparatus in accordance with a first embodiment of the present invention.

An ion beam implanter in accordance with the present invention achieves a wide ribbon beam of high uniformity at current above a milliampere and energy above several keV by utilizing a high current ion source, a first dipole magnet of shape and aspect to expand the beam with highly controlled aberrations in a single plane, and a multipole array to tailor the one-dimensional beam profile. In some embodiments the first magnet focuses the beam through an analyzing aperture and a second magnet further deflects and conditions the beam. The various constructions of the invention relax constraints addressed in applicant's aforesaid '926 patent, and yield high current ribbon implanter beamlines for commercial production. Unique properties of the system will be better understood from the following considerations.

Applicant has realized that an ion beam system accelerating milliampere beams to energies of a few keV that is analyzed and deflected with dipole magnets is subject to instabilities closely related in nature to those which have been reported to affect Calutrons used in isotope separation. A theoretical model of such instabilities has been presented by Igor Alexeff in IEEE Transactions on Plasma Science, Vol. PS-11, No. 2, June, 1983. These instabilities cause pronounced noisy oscillation in beam transmission at frequencies generally of several hundred kilohertz, and cause beam growth and loss of control of uniformity. Applicant has undertaken to design an ion implanter minimizing the effect of such instabilities, and has previously designed a highly controlled implanter system described in U.S. Pat. No. 5,350,926 which achieves a stable broad intense beam of a uniformity suitable for single-workpiece, i.e., serial, implanting. In accordance with the present invention, as described below, applicant has now designed commercially useful beams of a ribbon shape and high but not necessarily uniform current profiles adapted for efficiently implanting large workpieces, both in small batches and in larger production runs in commercial scan or workpiece transport systems. Applicant's new constructions rely upon beam tailoring with controlled multipole magnetic lenses.

In general, the uniformity of an ion beam varies along its length, and is extremely difficult to control. In accordance with the present invention, applicant controls the profile of a large ribbon-shaped beam in a single transverse direction, referred to herein as the beam width, integrated at each point in a direction transverse thereto along a cross-dimension referred to as the beam spread. In this regard, it is understood that even if the current profile of a beam is substantially smooth as it leaves an ion source, it generally does not remain so because the ions within the beam are travelling in a variety of directions. Aberrations in optical elements tend to generate caustics within the beam, observable as bright lines, as is familiar to practitioners in the field. Applicant addresses this difficulty by expanding the extracted ion beam to reduce the spread of angles within it, and by configuring the beam optical elements to control aberrations in one plane of interest at the expense of those aberrations which do not affect one-dimensional uniformity. However, unlike in a conventional lens, one or several ranks of discrete pole elements extend entirely across the beam, and their multipole aberrations are not reduced to zero; rather, local aberrations are controlled, e.g., by steppers or current drivers, to accurately produce the desired spatial variation of current density of the ion beam over the full width of the strip beam at a target plane downstream from the multipole.

An ion implanter constructed in accordance with this invention comprises an ion source, such as a Freeman, Bernas, or microwave source, from which the ion beam is extracted from a plasma maintained within the source through an extraction aperture, preferably a rectangle, or tapered slot. The plasma is distributed along the length of the slot by methods known to those skilled in the art, for example, by ensuring a high degree of uniformity in the ion source magnetic field, while the extracted beam current density may be made constant or non-constant, depending on the shape of the ultimately desired implantation beam. A non-constant source beam may be obtained, for example, by providing a tapered slot with diverging edges, or a similarly-aligned screen or control electrode. Preferably, however, the source is configured to produce a uniform profile, and the implanter system dipole magnet is shaped to yield the linear or other desired stationary or non-constant current distribution. A ribbon-shaped source beam extracted through the slot expands in both dimensions; preferably, as illustrated further below, one dimension diverges radially away from the center of curvature (shown schematically at "C" in FIG. 1) of the aperture through which it is extracted. Thus, the initial source provides a beam which extends across a width dimension, and has a beam form which is uniform or may be approximately the desired output beam distribution, for example is roughly uniform or is approximately monotonically increasing in current density from left to right along that width. A suitable source may be, for example, a White source, as described by N. White in Nucl. Instr. and Meth. B37/38 (1989) p.78, optimized for horizontal uniformity and having a beam divergence of about 0.08 radians.

In one embodiment, shown in FIG. 1, the source beam I travels through the gap of a large dipole magnet 3' (shown schematically) in which output trajectories are rendered substantially parallel while a rank of multipole elements 35 is positioned to produce the desired distribution of beam current density by a method described more fully below.

Figure 1A:
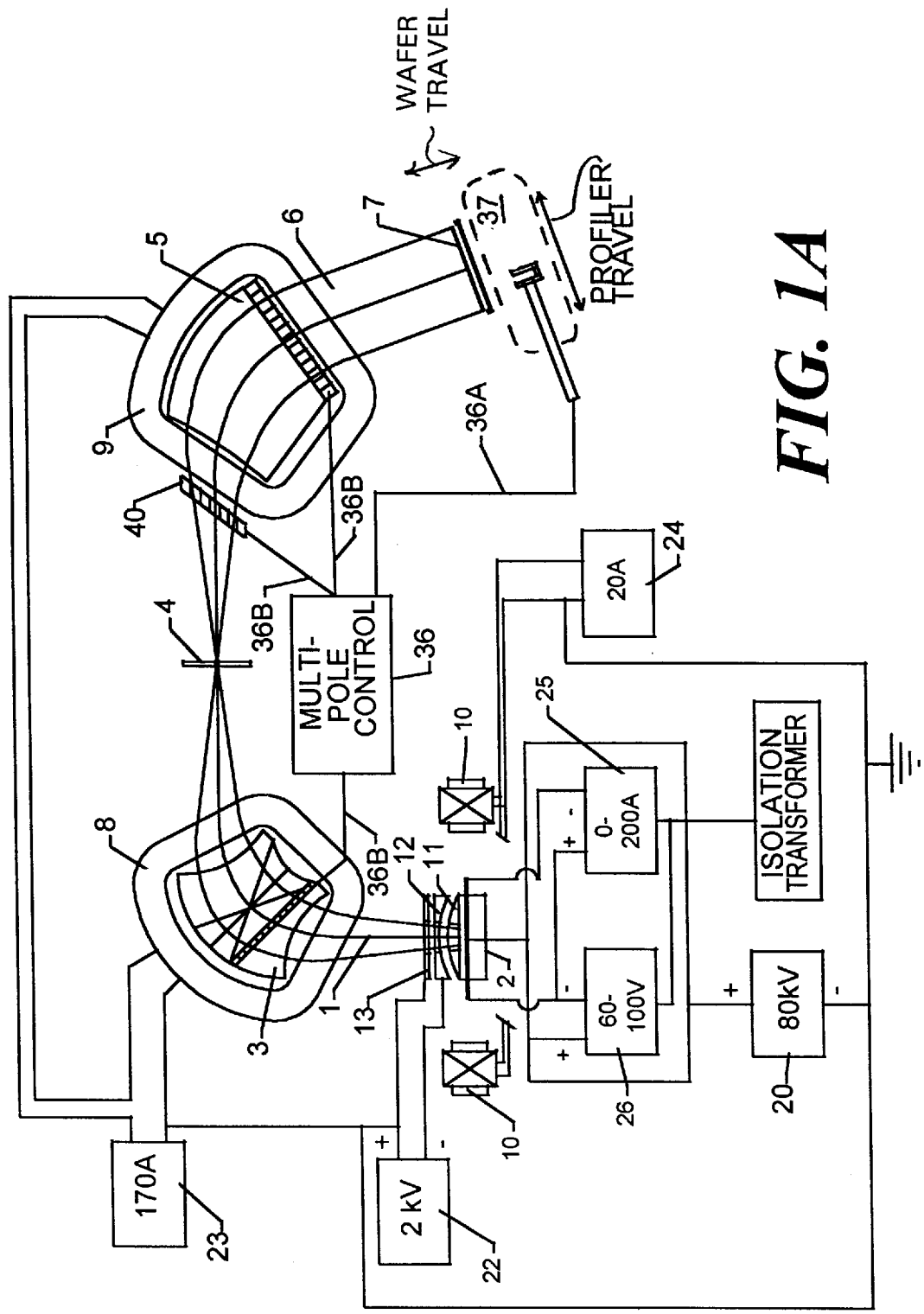
FIG. 1A shows a second embodiment of the invention.

In another embodiment, the dipole magnet 3 is an analyzing magnet which focuses the beam in both dimensions, deflects it, and is arranged so that the beam passes cleanly through a resolving aperture 4 (FIG. 1A). Unwanted components in the beam fail to be transmitted and are rejected. A second magnet 5 of similar dimensions to magnet 3 but of larger pole width accepts the divergent beam leaving the resolving aperture 4, and deflects and renders it parallel in both dimensions. The architecture of this embodiment is similar to that of the aforesaid '926 patent except that both the source and the multipole elements are operated to form a beam of non-uniform profile, such as a current density that increases linearly along the width direction of the beam, or one calculated to correct a specific non-constant scan velocity. Furthermore, the source may be one which produces a stable but non-uniform current profile, with the multipole elements largely shaping the final output profile.

The design of systems employing deflection magnets to control the focusing properties and the second-order aberrations may initially be done as described in the aforesaid '926 patent, e.g., using the well known and readily available computer program TRANSPORT, described by K. L. Brown in publications of the Stanford Linear Accelerator Center (SLAC). In general, using this program it can be arranged that there is a one to one mapping between the location at the ion source from which an ion leaves the plasma, and its position in the beam at the plane of the workpiece. However, in designing the magnetic elements for the ion beam of the present invention, applicant relaxes constraints to specify that this one to one mapping condition hold approximately in a single dimension, referred to as the width or horizontal direction in the embodiments described below. Under these conditions, then, the current distribution of the beam at the workpiece reflects the density of the plasma in this one dimension. The TRANSPORT program yields a magnet shaping the output beam with variations held to less than 4% before implementing further multipole control and adjustment steps described below to precisely tailor the beam current density profile. When the initial source is a wedge or tapered beam, the TRANSPORT design algorithms similarly may yield an output beam profile of comparable form.

In accordance with a preferred embodiment of the invention, beam profile is shaped and is further improved and tailored to accurately match the desired profile across the width and achieve 1% variation across the workpiece by providing a controller responsive to beam profile measurements for adjusting multipole components, which may be included in the design of the analyzing magnets, or may be provided as a separate unit or array of discrete adjustable electromagnetic multipole elements. Conceptually, these operate as follows.

The current density, $J_i$, at the implant position is in general a function of the horizontal transverse coordinate $x_i$, where the suffix i denotes the implant location. The following analysis characterizes as "horizontal" the variations in current density along the beam width, with the "vertical" current profile, corresponding to the beam spread, being integrated over the height of the beam. The term magnification, which should strictly only be discussed for an imaging system, is used, even though the system discussed is not necessarily an imaging system, since the concept of magnification is useful conceptually to portray the beam behavior. This is $$J_i = J_s/M$$

where the s suffix denotes the ion source location, and M is the magnification; beam attenuation effects are ignored in this analysis. The magnification is, by definition $$M = dx_i/dx_s$$

The magnification may itself be a function of x. It is well known (as described, for example, in publications by K. L. Brown) that the optical properties of such an ion optical system may conveniently be represented to second order, and in principal to any order, by a transfer matrix formalism, and this is used in the computer code TRANSPORT, which allows determination of the coefficients determining $x_i$ in the transfer relation:

$$x_1 = a_{11}x_s + a_{12}x_s' + \ldots + a_{111}x_s^2 + a_{112}x_sx_s' + a_{122}x_s'^2 + \ldots$$

The effect of angle x' is zero for an imaging system, but in general may be considered for greater accuracy. Neglecting x', $$M = a_{11} + 2a_{111}x_s$$

Thus the magnification can vary with the x coordinate, depending on the second and higher order transfer coefficients. The beam current density is inversely proportional to the magnification, and therefore is controllable by means of the second and higher order transfer coefficients. The transfer coefficients can be theoretically controlled by means of discrete multipole lenses, or by an arrangement similar to that described in the literature by Wollnik; although in a high current ion implanter this arrangement might occupy excessive space and involve considerable complexity and cost.

In the preferred embodiment of applicants' invention, these higher order terms are defined by a series of higher order magnet elements close to or directly in the dipole bending magnets, e.g. by incorporating shaped coils into the magnet pole faces, or providing a plurality of physically adjustably positioned steel pole shims.

In the preferred embodiment of applicant's invention, any required sextupole magnetic field components are permanently incorporated into the large dipole magnet design by curving the entrance and/or exit pole faces. Sextupole components are required, for example, to control and cancel certain undesired aberrations in an analyzing magnet. In addition, sextupole components may be deliberately added to induce an approximately linear variation in current density profile at the target position. However more accurate control of the current density profile is achieved with adjustable multipoles of a higher order than sextupole, and these are provided in applicant's system by a plurality of physically adjustably positionable pole shims, or a plurality of electromagnet elements disposed transverse to the beam.

In general, in the description below of systems having large dipole magnets, the analyzing magnet (if present) is optimized for low abberation, while the final or output dipole operates to bend the beam and render it parallel, and is configured with higher multipole units at its entrance, its exit, or both which are operate to provide aberrations that reduce variations from a desired output profile.

In ion optical applications, it is common to represent fields of multipole lenses in cylindrical polar coordinates, in the form:

$$B = -\nabla \Phi$$

$$\Phi = \Phi_1 r \cos(\theta + \delta_1) + \Phi_2 r^2 \cos(2\theta + \delta_2) + \Phi_3 r^3 \cos(3\theta + \delta_3) + \ldots$$

where $\Phi$ is the magnetic scalar potential and the first, second and third groupings of terms on the right side of the equation are the dipole, quadrupole and sextupole components, respectively.

However, this representation is only of practical use in the present context up to low orders, since the beam is a ribbon beam, in which the effects of non-vertical field components are not of primary interest. Assuming the major axis to be horizontal, the vertical field on the horizontal axis may be represented by:

$$B = \Sigma_i B_i f(x - a_i)$$

$$f(x) \approx \exp(-(x/\delta)^2)$$

where the $a_1$ are the x-coordinates of the centroids of the fields from each electromagnet pole, and $\delta$ is the characteristic width of the field produced by each pole. The function f(x) has been approximated in this representation, and a more accurate or analytically correct function can be substituted. This representation allows the influence of a pole on an ax$_i$al ray at any x-location to be evaluated for each multipole element, and in practice, applicant has found it to be sufficiently accurate for off-axis rays that the optical behavior of the multipole array is successfully modeled for the correcting discussed below.

In one system of the invention, the substrate is physically moved through the output ion beam, traversing its smaller dimension. The one-dimensional current density is proportional to the substrate velocity, and consistent dosing is achieved. The smaller beam dimension may vary without causing any variation in the integrated dose of ions delivered, provided that the substrate moves smoothly entirely through the beam. Focusing elements which cause desired variations in the one-dimensional density along the ion beam's longer dimension may also cause variations across the smaller dimension, but the latter variations are smoothed by the cross-scan and have no deleterious effect upon the performance of this invention.

The multipole element or elements control the field within a rectangular region through which the ion beam is passed. Preferably they are magnetic elements, since magnetic fields generally allow space-charge neutralization to be preserved within the ion beam. As noted above, a multipole element may for example consist of a set of movable iron or steel bars set within a larger magnetic pole piece, the bars being positioned by servomechanisms. Alternatively a multipole element may consist of electromagnets disposed around the ribbon-shaped ion beam, having their energizing coils connected to a set of separately controllable current sources.

In either case, general operation and adjustment of the poles is effected by a controller which receives beam current density profile measurements from a Faraday cup which profiles the beam through a slotted aperture as it travels across the beam width along its longer dimension (or a similarly located fixed sensor array), compares the profile to the desired distribution, and looks up or calculates a suitable set of adjustments to the individual current sources, servomechanisms, or other means of pole adjustment to decrease the error function so derived. The new settings are applied to the multipoles, and the process is repeated until the beam profile corresponds within a set tolerance to the desired profile. The controller may be implemented, in a manner known from general control theory, as an automated microprocessor controller in a manner known in the field of process control, by measuring and tabulating the transfer function of each pole element, modeling a set of adjustments and providing a set of control rules, which may be fixed or adaptive. The finite-state controller so made can then be optimized to utilize a smaller set of measurement inputs, control rules, or states. In the present case, the various system parameters are sufficiently stable and repeatable that once the operating parameters of the implanter are empirically set (i.e., from a previously compiled table of settings) for a particular energy and species, the fine tuning is readily performed by an operator in a small number of steps.

The basic method of adjusting a multipole lens to achieve a desire one-dimensional current density profile in a ribbon-shaped ion beam used to implant targets with ions involves the following steps.

First, setting up a computer model of the ion optical system through which the ion beam is transported, using a representation of the lensing effects of each multipole and the dipole magnets. In this model, the ion beam is preferably represented by an array of rays which are initially uniformly spaced, and in which the resulting current density on the target is proportional to the current represented by each ray, and is inversely proportional to the spacing between rays. One then measures the profile along its major transverse dimension of the current density of the real ion beam at the target plane and stores this measurement as an array of points in computer memory. This gives the actual input/output transfer function of the system. Next, one calibrates the model so that its output matches the observed ion beam current density profile for each of the observed or possible conditions, and this profile is compared with the desired reference output profile to obtain an error function which increases with increasing discrepancy between the desired profile and the measured profile within the target region at the implantation plane. The controller then iteratively makes systematic adjustments to the settings of the multipole lens elements, calculating the resulting profile using the computer model, calculating a new error function, rejecting settings which increase the error, and preserving settings which reduce the error. In operation of the ion beam, a fresh measurement of the profile is made from time to time and the model is recalibrated until either the desired profile is achieved within a set tolerance, or no further improvement can be obtained using a given multipole lens.

With the foregoing considerations in mind, a detailed description of the illustrated embodiments of the invention will now be given.

In FIG. 1, an implanter system 100' operates with an ion beam I produced by ion source 2. Various ion sources 2 may be used, including Freeman, Bernas, or microwave ion sources, a Bernas source modified as described by White being illustrated. Ion beam 1 is ribbon-shaped, being initially between 50 and 75 mm wide but only 2 to 5 mm high as it exits a curved slot in ion source 2.

Figure 2A:
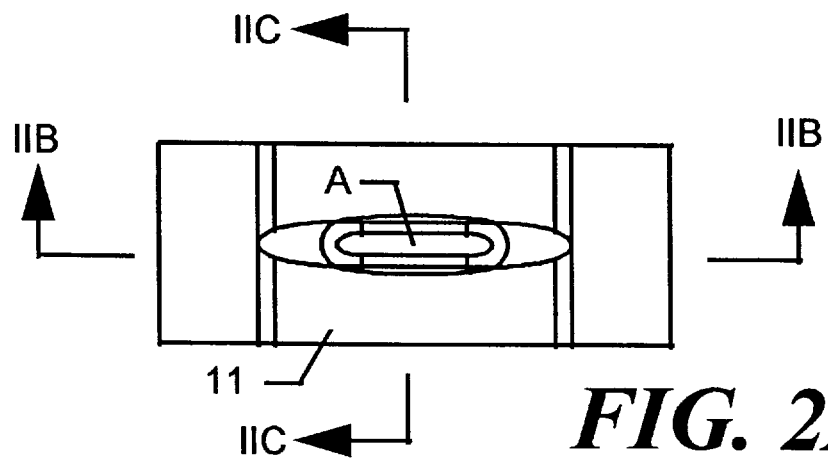
FIGS. 2A–2C are views of extraction grids in a suitable ion source for the apparatus of FIG. 1

The source provides a spatially stationary and substantially smooth distribution of ions across a slot shaped aperture, indicated generally by "A" in FIG. 2A, and as further illustrated in FIG. 1A includes a power source 25 for passing current through a hot filament (not numbered) and a magnet 10 energized by magnet power supply 24 to constrain the emitted electrons so that gas or vapor in the source chamber is efficiently and uniformly ionized. An arrangement of three slotted grids 11, 12, 13 serve to confine, extract and accelerate ions from the source. The source may have slots of constant height to produce a uniform ion beam, or sloping height to produce a beam with a current that increases with width coordinate, or may otherwise produce a tailored beam profile. However the discussion below shall generally assume that the source provides a uniform profile, because uniform sources are well developed and are sufficient for modeling and creating the output profiles described herein.

Figure 2B:
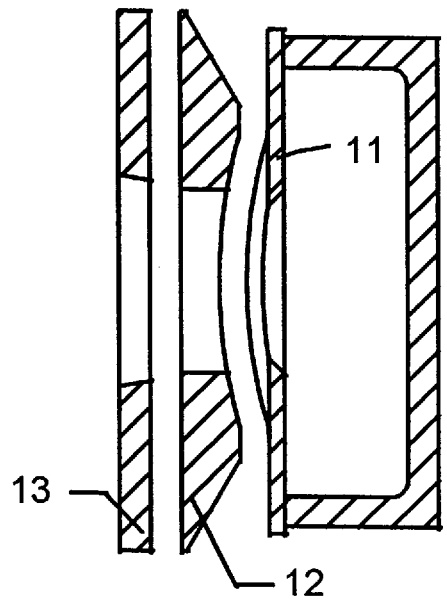
Figure 2C:
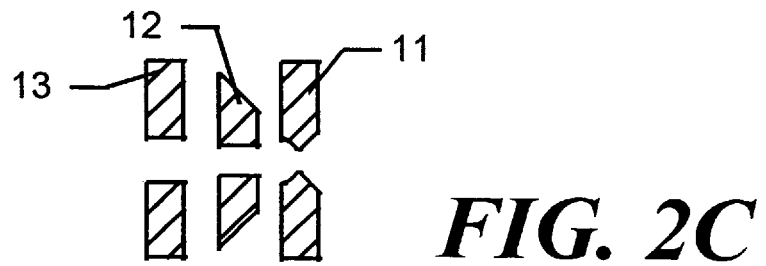

As shown in greater detail in FIGS. 2A–2C, in the preferred source, the extraction grid 11 is bowed convexly outward, and has a slot with its top and bottom edges parallel, narrowing at the very ends of the slot. The front and rear surfaces are beveled so that the slot edges are knife-edged, as seen in the vertical sectional view, FIG. 2B. The slot 11 from which ion beam 1 is extracted from the plasma in ion source 2 is curved such that the ions in the beam are initially accelerated normal to the surface along trajectories that diverge from a point center of curvature ("C", FIG. 1) located approximately 150 mm behind the ion source grid 11, and diverge at an angle greater than +/−5 degrees in the horizontal plane. The slot has parallel curved sides, and a height of between 2 and 5 mm. The second grid 12 is formed of thick graphite or metal stock and has its right, or source-facing surface as shown in FIG. 2B which is parallel to the contour of grid 11, so that emitted ions are accelerated radially outward, i.e., normal to the surface contour of grid 11. Grid 12 has a flat left face, the slot aperture of grid 12 being slightly larger than that of grid 11 so that the second grid is not eroded by emitted ions. Another grid 13, which is connected to the negative (grounded) side of the high voltage source 20, is a flat plate, parallel to the left face of grid 12, and having a slot in registry with that of grid 12. A suppression power supply is connected between grids 12 and 13 to maintain the intermediate grid at a higher potential difference with respect to the ion source 2, so that the energy of the extracted beam is decreased in passing from grid 12 to grid 13, and the beam is slightly collimated. Representative values are indicated for an 80 keV system, although it will be understood that in practice the system may be adjusted to deliver ions of any energy below 80 keV, and in that case the suppression source is adjusted accordingly, for example to a voltage level that minimizes grid intercept current. The source slot is shown as parallel, but may taper in the width direction, or may be operated with a plasma chamber having an asymmetric construction to produce a wide wedge beam rather than an entirely uniform curtain.

Continuing now with the schematic FIG. 1, the ribbon-shaped ion beam I diverging in its width direction passes over the multipole array 35, where the entering beam is portrayed with lines marking regions of equal current. A relatively large number of multipoles, e.g. one or several rows of ten or more separate elements $35_i$, $35_j$ are positioned entirely across the beam width and are each operated to adjust the current density in the strip passing thereover using the model described above, modifying the beam distribution so that the beam 1a entering the bending magnet 3' is corrected to the desired output profile, shown as a constant current (i.e. equispaced lines) output profile, in the output beam 1b. Small variations in the beam height will be caused by the different multipoles, but provided the wafer at the implant position "WI" is fully scanned through the beam spread, the height of the beam affects neither the dose nor uniformity of the implant. It will be understood that the magnetic lens 3' is a relatively large-faced, e.g. 400 mm×500 mm curved trapezoidal assembly, similar to magnet 5 of FIG. 1A described below, and the multipole-modified input beam 1b enters between the poles of electromagnet 3' which has a field generally oriented in a cross direction, so the field deflects the ion beam 1 through an angle to both flatten diverging trajectories and bend the beam through a curve of about seventy degrees to an implant position. This assures that the workpiece is not in a line-of-sight path to the source.

Thus, this first embodiment utilizes the relatively simple structure of a simple large dipole and a beam-spanning multipole array to achieve a highly precise and parallel implantation beam, of constant, linear, curved or other preselected current density profile. By producing a precise output profile, the beam is simply matched to the transport characteristics of an existing mechanical transport, greatly simplifying the process of acieving implant dose control and uniformity.

In a second embodiment, shown in FIG. 1A, the system has an overall layout similar to that of the aforesaid '926 patent, but instead of using a small number of multipoles in an analyzing magnet to correct a constant beam at high power, the magnet line is designed and configured to produce an analyzed beam with a non-constant but precise output beam profile.

In this embodiment, magnet 3 is an analyzing magnet as described in the '926 patent which compresses the expanding spread of beam 1 to focus it in the beam spread dimension through a resolving aperture 4.

Ion beam 1 diverges again after passing through the resolving aperture 4, and passes between the poles of a second electromagnet 5, which deflects it through a further angle. The poles of both electromagnets 3 and 5 are designed to provide an exiting ion beam 6 with the properties that introduce or preserve a non-constant one-dimensional beam current distribution across its width, with trajectories substantially parallel and free from unwanted ion species and from ions of incorrect energy.

The current profile of the exiting ion beam 1 is controlled by modifying the secondand higher-order transfer coefficients of electromagnet 3, and/or those of electromagnet 5. In the preferred embodiment this is accomplished by moving pieces of specially contoured pole inserts in the central region of the pole pieces of magnet 5 across the usable portion of the beam, to introduce variations in the sextupole, octupole and higher-order magnetic field components of the magnet, which are referred to herein generally as multipole components.

Figure 3:
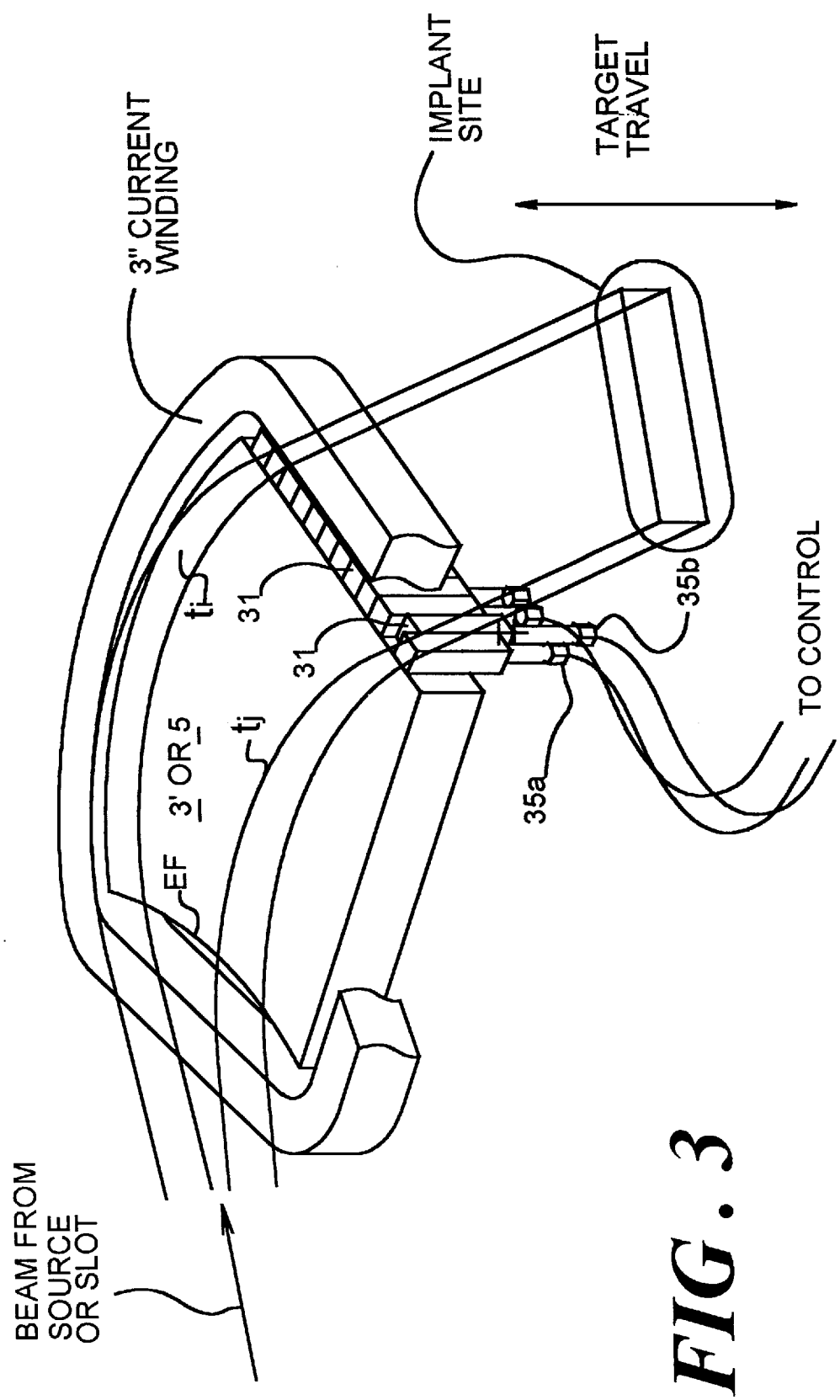
FIG. 3 is a perspective view of one pole piece of the dipole magnet of the apparatus of FIG. 1.

FIG. 3 illustrates trajectories ti through a magnet 3' in a beamline of FIG. 1. Magnet 3' is similar to the bending, trajectory-straightening magnet 5 of FIG. 1A. A line of twelve bars 31 each 1.5×1×12 inches long is incorporated directly within the coil 39" of the magnet 3', and is set against a flat exit face of the pole of magnet 3' and provided with driver mechanisms 35a, . . . so they are capable of lying flush with the pole surface or of individually being withdrawn about one inch below the surface. This set of bars 31 provides the desired adjustable multipole lens, each bar being effective to concentrate or disperse the distribution of ion trajectories in the beam width direction, hence alter the current density, in a narrow band of trajectories $t_i$, $t_j$ of the beam passing thereover. In general it is sufficient that the bars, rods or other pole elements have a spacing or pitch that is no more than about one-half of the height of the gap of the large dipole through which the beam passes. Thus, for the preferred 3–4 inch gap, applicant employs a pitch of 1½ to 2 inches.

It should be noted that in FIG. 1A a similar line of bars, but 1.5"×2.0", is set along the exit edge of magnet pole 5, i.e. the second, bending magnet, of an analyzing beamline. This configuration at the pole edge allows a greater range of adjustment than positioning the pole elements within the magnet pole. In each case, the bars are driven by a lead screw and electric motor, and their position is read by means of a linear potentiometer whose springloaded extending actuator contacts the moving end of the bar, to provide position data regarding the adjustment of each bar to the controller 36. In both embodiments, the adjustable bars may be provided for both upper and lower pole pieces, thus projecting on opposite sides of the beam and providing an even greater range of local magnetic field adjustment. However, for a practical embodiment, a single row of adjustable bars is preferred for implementing a simple and dependable control. The control may, for example, form a monotonic beam current density profile suitable for a spinning drum implanter system. As shown in FIG. 3, the beam entry face EF may be contoured to alter the beam shape and determine the rough current density distribution of the output.

Yet a third embodiment is implemented with a separate and discrete magnetic multipole array which is positioned across the beam path. Such shaping array is shown as a multipole 40 in FIG. 1A, and it may, for example, have twenty-six poles, each powered by a coil and arranged in two rows of thirteen poles set above and below a beam tunnel having a rectangular cross-sectional aperture 4" high×16" wide. These non-moving poles have iron or steel cores which extend flush to a common plane, and are long and narrow, for example one by five centimeters in that plane, with each of their long dimension aligned parallel to the beam trajectories passing thereover. Thus, the angle of the blade-like pole elements changes progressively across the beam. The narrow long pole pieces assure that the ion beam is clearly separated into simple trajectory bands for modeling the ion optics, and that each band passes its pole element with relatively long travel over the correcting field. As in the other multipole constructions, the pole elements extend entirely across the beam, so they lie approximately on a 1" pitch. Each pole in a representative embodiment extends about 4" above or below the beam, outside the vacuum tunnel, where they are screwed to a steel yoke which serves to return the magnetic flux. The windings of opposite pairs of poles may optionally be connected in series. The coils of multipole 40 are preferably powered, individually or in thirteen pairs, by pulse-width modulated current sources, such as those sold commercially for the purpose of powering servo motors. The PWM sources are controlled by the controller 36 (FIG. 1A). In either case, by providing a higher field over a bar, the ions traveling over the bar are shifted, raising current density on one side of the narrow band $t_i$, and decreasing it in the remaining part of that band.

In accordance with this aspect of the invention, a control unit 36 receives beam intensity information along line 36a from a beam profiler 37 located near or behind the implant plane and sends control signals along control lines 36b to control the multipole elements in magnet 3, magnet 5 or array 40 to adjust the beam profile to the desired current density distribution. The profiler may be operated between processing runs, or intermittently at intervals of weeks or months, to determine corrections which have become necessary due to aging of components and variations in the power supplies. Preferably, however, control unit 36 adjusts the multipole elements according to a control program which proceeds first from a theoretical beam focusing model, but is augmented by practical control and stabilization protocols, i.e. by an "optimized" or minimal "controller" which is developed in a manner known from control theory and substantially as described above to effect stable and dependable beam correction in operating under diverse conditions. Adjustment in this manner achieves a much higher degree of control of the current density profile in the output beam 6 than would be achieved with a fixed design magnet or set of magnets alone.

At the implant position a target 7 is moved up and down at a controlled velocity on a stage 7a. Ion beam 6 does not fluctuate in magnitude over time, so a uniform implant is accomplished by moving target 7 through the output beam 6 provided its vertical component of velocity matches the beam width current density profile (where vertical is understood to mean in the beam spread direction, i.e., transverse to the wide dimension of the beam and across the beam axis, perpendicular to the plane of the FIGURE). As noted above, for different embodiments, the target 7 moves in a straight line or on a curvilinear path during its passage across the beam 6, with the beam profile providing a complementary current distribution to result in a constant dose.

A secondary, non-magnetic, beam adjustment or a beam trimming means, for example, a plurality of overlapping beam scrapers as described in the aforesaid '926 patent may be provided. In that case, they are arranged generally transverse to the ion beam 1 close to magnet 3 or magnet 5, in the beam line. Such scrapers may be used to reduce the current locally where a peak in the current density is found to occur which for some reason is not adequately reduced or controlled by the multipole shaping elements. Final adjustment of the inserts 31 is then made after the beam profiler 37 measures beam intensity in an array of points in the output beam to determine the necessary changes.

Figure 4:
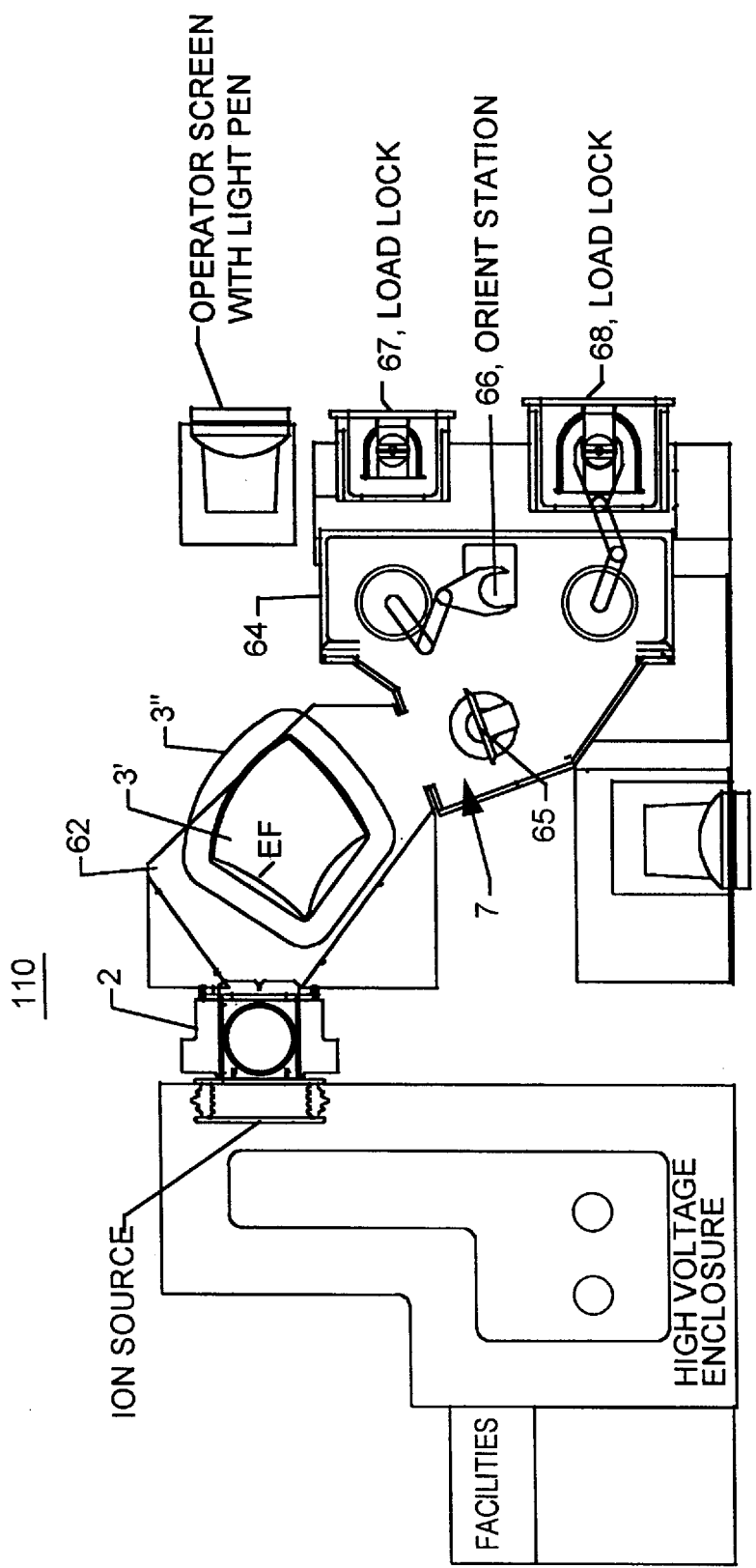
FIG. 4 is a drawing, partly schematic, of a complete implanter system employing the first embodiment of an ion beam apparatus of the present invention.
Figure 5:
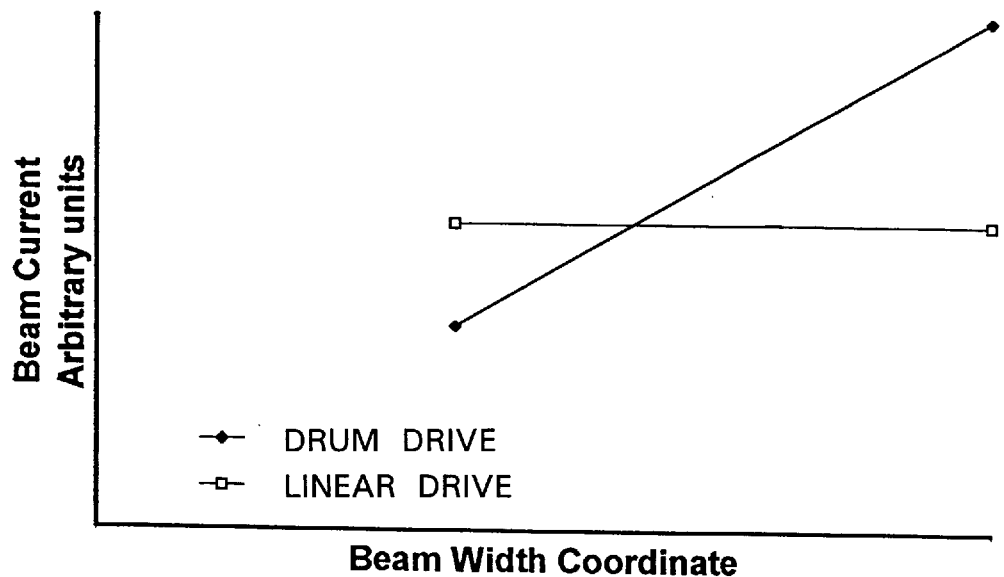
FIGS. 5 and 5A illustrate beam current and workpiece dwell, respectively, of an implantation system using applicants ion beam apparatus.
Figure 5A:
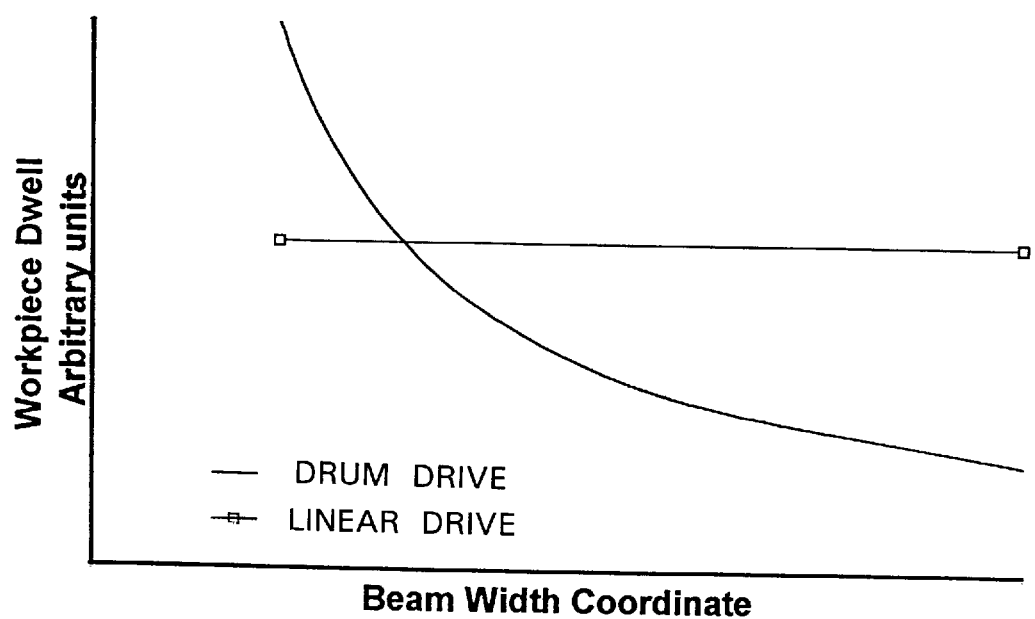

FIG. 4 illustrates by way of practical example a top schematic view of one effective beam line 110 employing the seventy degree bending magnet 3' of FIG. 3. As shown, an ion source 2 such as the above-described White source projects its beam through a vacuum tunnel defined by vacuum housing 62 which passes between the poles of magnet 3', and is shaped and directed into a larger vacuum assembly 64 at a wafer implant position 7 in a processing station 65. Station 65 receives wafers from and returns wafers to load locks 67, 68 via a transfer robot 66 substantially as described in U.S. Pat. No. 5,486,080 of inventor Manny Sieradzki. As shown, the tunnel between magnet 3' and its coil 3" compactly connects the source and implantation stations. The beam entry face EF is shown as concave in the horizontal plane to provide effective bending for the large divergent source beam 1. However, it will be understood that when shaping a uniform source beam 1 into a beam of generally linear or non-constant current distribution, a straight, convex or other curved entry face may be employed to provide longer or shorter paths through the gap and shift overall current accordingly. While not illustrated, other ranks of multipole elements may be provided, such as a separate multipole similar to multipole 40 of FIG. 1A at the entry, or a line of elements extending across the pole at a position earlier than the exit face.

The invention being thus disclosed, variations and modifications will occur to those skilled in the art. The system may be increased or decreased in scale, the orientation of the beam forming and shaping elements may be vertical instead of horizontal, and various reflections and modifications of the disclosed geometry may be made. The system employing two large dipole magnets may be arranged so the two magnets need not bend in the same direction. A variety of arrangements including conveyor belts, spinning drums and others may be used to pass the target 7 through the ion beam 6, and means may be included to vary the orientation of the target 7 with respect to the direction of ion beam 6 where precise but non-normal implantation is desired. Different adjustable multipole arrays may be used, such as vertically adjustable iron rods placed against the outer edge of the pole piece and transversely arranged with respect to the ion beam, or separate multipole units placed ahead of or behind a dipole bending magnet. These and all such variations and modifications are intended to be within the scope of the invention, as defined in the claims appended hereto.

What is claimed is:

1. Apparatus for uniformly implanting targets with an ion beam, said apparatus being configured for use with an ion source which produces an ion beam containing ions of a desired species and which diverges in at least one direction along a beam path, and with a workpiece transport which is effective for traversing a workpiece through said ion beam at a velocity having a velocity profile, said apparatus comprising a single dipole magnet in the beam path which receives a source beam and bends it forming the desired species into an output beam of ribbon shape, with a major transverse dimension exceeding two hundred millimeters and with a minor dimension, and rendering ions of the output beam parallel within about one degree an adjustable multipole ion lens extending substantially entirely across said beam path, said lens and dipole magnets forming said output beam with a desired current profile; and means responsive to a measurement of current density of said output beam near an implant location for setting pole elements of said ion lens to modify aberrations to reduce variations from the desired profile, said desired profile being complementary to the velocity profile and thereby effective for implanting a substantially uniform dose of ions into the workpiece.

2. The apparatus of claim 1 in which said multipole ion lens is incorporated into said dipole magnet, said lens comprising a set of movable ferritic bars moving within at least one pole of said dipole magnet, movement of said bars modifying multipole components of the magnetic field of said magnet by locally changing the effective gap between the poles.

3. The apparatus of claim 1 in which said multipole ion lens comprises a first set of at least three electromagnets sharing a common return yoke, with magnetic poles of said electromagnets disposed in a line transverse to said ion beam, close to it, and parallel to its major transverse dimension, each electromagnet being supplied from a separately controllable current source, and said set extending substantially entirely across said major transverse dimension.

4. The apparatus of claim 3 in which said multipole ion lens further comprises a second set of electromagnets disposed in a second line parallel to and on the opposite side of the ion beam from the first set.

5. The apparatus of claim 3 in which said magnetic poles are narrow blades oriented at progressive angles to be parallel to beam trajectories passing thereover.

6. The apparatus of any of claims 1 through 5 in which said adjustable multipole ion lens is controlled responsive to a profiler which samples one-dimensional current density data across said major dimension.

7. The apparatus of claim 1 for use with a rotating workpiece transport that traverses a workpiece through the beam by rotation about an axis, and in which the desired current profile is a profile proportional to the distance from the axis of rotation, thereby imparting a uniform dose of ions to the workpiece.

8. In a method of implanting a target with an ion beam, the steps of
generating an ion beam containing ions of a desired species which diverges in at least one direction,
passing said beam through a dipole magnet so as to
  i) form ions of the desired species into an output beam of ribbon shape, with a major transverse dimension greater than two hundred millimeters and with a minor dimension, and
  ii) render ions of the output beam parallel within about one degree
measuring current density profile of said ion beam along its major transverse dimension
adjusting a plurality of multipole elements arranged to extend substantially across the ion beam to modify aberrations and fit current density profile of said output beam to a desired profile, and
scanning a workpiece to be treated through said output ion beam at a velocity in relation to said profile effective to accurately implant a uniform dose of ions into the workpiece.

9. A method of adjusting a multipole lens to achieve a desired one-dimensional current density profile in a ribbon-shaped ion beam used to implant targets with ions, such method comprising the steps of
setting up a computer model of the ion optical system through which the ion beam is transported, in which the ion beam is represented by an array of rays which are initially uniformly spaced, and in which resulting current density on the target is proportional to current represented by each ray, and is inversely proportional to spacing between rays
measuring the profile of the current density along a major transverse dimension of the real ion beam and storing this measurement as an array of points in computer memory
calibrating the model so that its output matches observed ion beam current density profile
comparing said measured profile with a desired reference profile and calculating an error function, said error function indicating discrepancy between the desired profile and the measured profile in a target implant region
iteratively adjusting settings of the multipole lens elements, calculating a resulting profile according to a model, calculating a new error function, and saving a setting which reduces error, and
setting the multipole elements according to a setting obtained in a previous step in order to accurately obtain said output beam with the desired profile.

10. Apparatus for uniformly implanting targets with an ion beam, such apparatus comprising
an ion source which produces an ion beam containing ions of a desired species and which diverges in at least one direction along a beam path
a first dipole magnet in the beam path which forms the desired species into an output beam of ribbon shape, with a major transverse dimension larger than a face of a workpiece to be implanted, and with a minor dimension small relative to said workpiece, said magnet rendering ions of the output beam parallel within about one degree
profiling means for measuring current density of said ion beam along its major transverse dimension
at least one multipole ion lens in said beam path adjustable over a range of aberration for controlling current density profile to a desired profile and
means for traversing a workpiece or batch of workpieces through said ion beam at a velocity effective to implant a substantially uniform dose of ions into the workpiece.

11. The apparatus of claim 10, further comprising means for varying an angle at which the workpiece is held thereby varying incidence angle of ions and azimuth with respect to a reference direction on the workpiece.

12. Apparatus for ion implantation, such apparatus comprising
a first dipole magnet effective to receive a divergent source beam, bend the beam through an angle and bring it to a focus
a resolving aperture at said focus
a first dipole magnet effective to receive ions of a desired species from the aperture and form the ions into an output beam having a major transverse dimension over two hundred millimeters with ions of the output beam being substantially parallel within about one degree, and
a multipole element extending substantially entirely across said beam and having plural adjustable pole elements effective to provide aberrations which accurately fit output beam current density profile to a desire non-constant profile.

13. In a method of implanting a workpiece with an ion beam, the steps of:
generating a divergent ion beam including a desired ion species, and passing it through a first magnet which focuses the desired species through a resolving slit, thereby rejecting unwanted species and forming a beam of said desired species,
passing said beam of said desired species through a second magnet whose ion-optical properties form said beam of desired species into an output beam of ribbon shape, with a major transverse dimension larger than a face of the workpiece to be implanted, and with a minor dimension small relative to said workpiece, ions of the output beam being rendered parallel within about one degree, and matching a non-uniform current profile along said major dimension across the width of the workpiece, mounting the workpiece on a scanning mechanism at a selected angle and orientation relative to the direction of said ion beam, adjusting a plurality of multipole elements extending entirely across the beam to accurately fit said non-uniform current to a desired non-uniform profile, and scanning said workpiece through said ion beam one or more times at a velocity in relation to ion beam current, effective to implant a dose of ions into the workpiece which is substantially uniform in angle, orientation and dose per unit area.

14. In the method of claim 13, the step wherein said multipole elements control ion beam current to fit said desired profile within about two per cent across the width of the workpiece.

* * * * *

UNITED STATES PATENT AND TRADEMARK OFFICE
CERTIFICATE OF CORRECTION

PATENT NO. : 5,834,786                                 Page 1 of 2
DATED : November 10, 1998
INVENTOR(S) : Nicholas R. White et al.

It is certified that error appears in the above-identified patent and that said Letters Patent is hereby corrected as shown below:

Column 4, line 53, after "apparatus of Fig. 1" please insert --;--.

Column 6, line 25, after "source beam" replace "I" with --1--.

Column 8, line 47, replace "ax$_i$al" with --axial--.

Column 10, line 5, after "beam" replace "I" with --1--.

Column 10, line 67, after "beam" replace "I" with --1--.

UNITED STATES PATENT AND TRADEMARK OFFICE
CERTIFICATE OF CORRECTION

PATENT NO. : 5,834,786
DATED : November 10, 1998
INVENTOR(S) : Nicholas R. White et al.

It is certified that error appears in the above-identified patent and that said Letters Patent is hereby corrected as shown below:

Column 11, line 64, replace "ti" with --$t_i$--.

Column 12, line 1, replace "39"" with --3"--.

Column 16, line 40, replace "first" with --second--.

Signed and Sealed this

Twenty-eighth Day of December, 1999

*Attest:*

Q. TODD DICKINSON

*Attesting Officer*   *Acting Commissioner of Patents and Trademarks*